United States Patent
Baker

(10) Patent No.: US 6,812,517 B2
(45) Date of Patent: Nov. 2, 2004

(54) DIELECTRIC STORAGE MEMORY CELL HAVING HIGH PERMITTIVITY TOP DIELECTRIC AND METHOD THEREFOR

(75) Inventor: Frank Kelsey Baker, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 1 day.

(21) Appl. No.: 10/230,810

(22) Filed: Aug. 29, 2002

(65) Prior Publication Data

US 2004/0041192 A1 Mar. 4, 2004

(51) Int. Cl.[7] ............................................. H01L 29/788
(52) U.S. Cl. ................................. 257/315; 257/E29.309
(58) Field of Search .......................... 257/315, E29.309

(56) References Cited

U.S. PATENT DOCUMENTS

| | | | |
|---|---|---|---|
| 4,360,900 A | | 11/1982 | Bate |
| 5,861,347 A | * | 1/1999 | Maiti et al. .................. 438/787 |
| 5,876,788 A | | 3/1999 | Bronner et al. |
| 6,245,652 B1 | | 6/2001 | Gardner et al. |
| 6,297,095 B1 | | 10/2001 | Muralidhar et al. |
| 6,511,925 B1 | * | 1/2003 | Aronowitz et al. .......... 438/788 |
| 2003/0042527 A1 | * | 3/2003 | Forbes et al. ................ 257/315 |
| 2003/0047755 A1 | * | 3/2003 | Lee et al. .................... 257/200 |
| 2003/0153149 A1 | * | 8/2003 | Dong et al. .................. 438/257 |

FOREIGN PATENT DOCUMENTS

| | | |
|---|---|---|
| DE | 19903598 A1 | 8/2000 |
| JP | 58021871 | 2/1983 |
| WO | WO 8204162 A1 | 11/1982 |

OTHER PUBLICATIONS

Lee et al., "A Novel High K Inter–Poly Dielectric (IPD), $Al_2O_3$ for Low Voltage/High Speed Flash Memories: Erasing in msecs at 3.3V," 1997 Symposium on VLSI Technology Digest of Technical Papers, Jun. 1997, pp. 117–118.
PCT/US03/22991 International Search Report.

* cited by examiner

Primary Examiner—David Nelms
Assistant Examiner—Tu-Tu Ho
(74) Attorney, Agent, or Firm—James L. Clingan, Jr.; Robert L. King

(57) ABSTRACT

A non-volatile memory (NVM) cell, which uses a storage dielectric as the storage element, has a top dielectric between a gate and the storage dielectric and a bottom dielectric between a semiconductor substrate and the storage dielectric. The top dielectric includes a relatively thick and high k dielectric layer and an interfacial layer. The interfacial layer is very thin and has a higher k than silicon oxide. The bottom dielectric layer is preferably silicon oxide because of its interfacial and tunneling properties. The cell thus has benefits resulting from a well-passivated, high k top dielectric in combination with a bottom dielectric of silicon oxide.

13 Claims, 3 Drawing Sheets

US 6,812,517 B2

DIELECTRIC STORAGE MEMORY CELL HAVING HIGH PERMITTIVITY TOP DIELECTRIC AND METHOD THEREFOR

FIELD OF THE INVENTION

The invention relates to non-volatile memories, and more particularly to, memory cells using a dielectric layer for storage of charge.

RELATED ART

One of the difficulties in non-volatile memories (NVMs) is a sufficiently fast erase time. Erase time needs typically to be less than 1 second. NVMs that use a dielectric layer, typically silicon nitride, as the structure for storing charge provide a significant cost benefit over NVMs using conventional floating gates. In the case of NVMs with a silicon nitride storage layer, there is a bottom dielectric between the substrate and the silicon nitride layer. This dielectric is typically silicon oxide because of its ability to experience tunneling with minimal destructive effect and its good interfacial qualities. The difficulty is that this layer is preferably thin for erase performance but preferably thick to avoid leakage of charge from the silicon nitride layer that is storing charge. Thus, there is a tradeoff between the erase time and leakage. The result can be that there is no satisfactory point at which there is both an adequately fast erase time and a sufficiently low leakage.

One solution has been to use hot hole injection (HHI) to neutralize electrons in the nitride layer. This allows for a thicker oxide while still achieving relatively fast neutralization of the trapped charge in the silicon nitride layer. One problem is that hot holes are generated in a relatively localized area and may be limited in area where the trapped charge can be neutralized so trapped charge outside of this limited area may not be neutralized. This makes the erasure incomplete and perhaps provides insufficient differential between programmed and erased states. Another problem is that hot hole injection tends to be more damaging to the oxide between the silicon nitride and the substrate than tunneling. The damage results in lower endurance.

Thus there is a need for a NVM cell, of the type having a dielectric layer that acts as the storage element, with an improved erase characteristic.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A non-volatile memory cell has a storage dielectric as a storage element and has a top dielectric over the storage dielectric and a bottom dielectric under the storage dielectric. The bottom layer is preferably silicon oxide to take advantage of its interfacial and tunneling characteristics. The top dielectric includes a relatively thick and high k (relative permittivity) dielectric layer and an interfacial layer. The interfacial layer is very thin and has a higher k than silicon oxide. This results in a significantly improved erase characteristic for a given bottom layer thickness and a passivated top dielectric. The invention is better understood with reference to the following description of specific embodiments.

Figure 1:
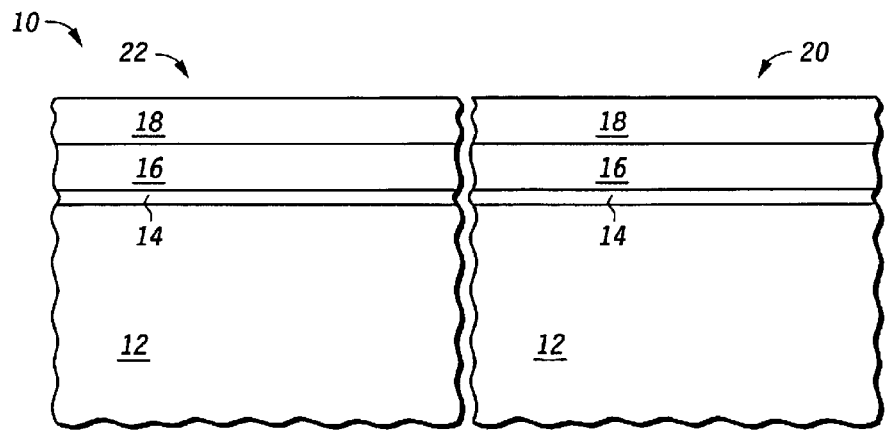
FIGS. 1–6 are cross sections, in sequential steps of processing, of a semiconductor according to a preferred embodiment of the invention.

Shown in FIG. 1 is a semiconductor device 10 comprising a semiconductor substrate 12, a silicon oxide layer 14 over substrate 12, a silicon nitride layer 16 over silicon oxide layer 14, and a high k dielectric layer 18 over silicon nitride layer 16. Semiconductor device 10 has a non-volatile memory (NVM) portion 22 and a transistor portion 20. Substrate 12 is preferably silicon and may be SOI or may be another semiconductor material. High k dielectric layer 18 may preferably comprise a high permittivity material such as hafnium oxide, aluminum oxide, lanthanum oxide, and suicides and nitrides of those materials. Lanthanum silicon oxynitride is one such example. Other high k dielectrics that have a dielectric constant that is at least about 10 (ten) is preferable but a dielectric constant of at least 6 (six) will also be effective. Another factor to consider is potential barrier for high k dielectric layer 18. Preferably the potential barrier should be high to prevent electron injection from the overlying gate electrode. These layers 14–18 may be formed by any conventional method. In the case of silicon oxide layer 14, it is preferably grown at a relatively high temperature to maximize its quality. Silicon nitride layer 16 may also be other dielectrics that are effective as storage elements. One such example is silicon oxynitride. Other dielectrics that can store charge could also be used in place of nitride layer 16. Particularly desirable would be charge storage dielectrics that have a high permittivity. High k dielectric layer 18 may have a thickness between seventy and two hundred and fifty Angstroms.

Figure 2:
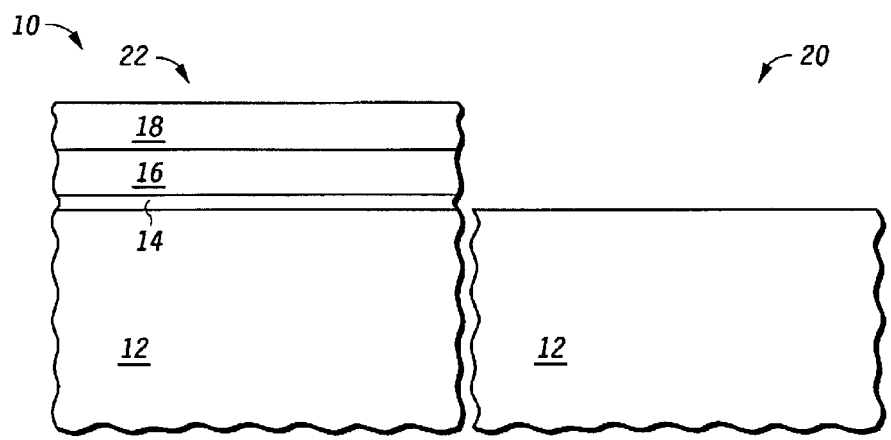

Shown in FIG. 2 is semiconductor device 10 after silicon oxide layer 14, silicon nitride layer 16, and high k dielectric layer 18 have been removed from transistor portion 20 but left remaining in NVM portion 22. This is preferably performed by a conventional lithography mask step followed by an etch step. The etch step will require a change in chemistries to effectively etch the diverse material of layers 14, 16, and 18.

Figure 3:
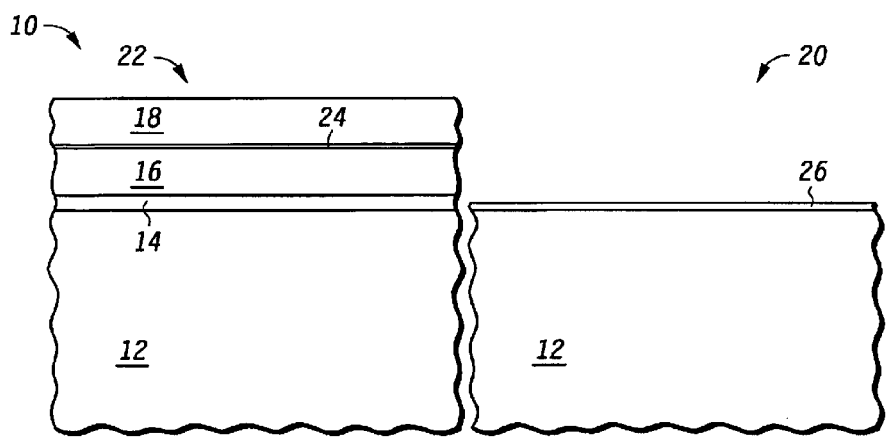

Shown in FIG. 3 is semiconductor device 10 after formation of gate dielectric 26 on substrate 12 in transistor portion 20 and an interfacial layer 24 between silicon nitride layer 16 and high k dielectric 18 in NVM portion 22. For the preferable case of gate dielectric 26 being formed growing a silicon oxide film, interfacial layer 24 is formed also during this silicon oxide growth, achieved by flowing an oxygen-containing gas, in transistor portion 20 and is formed to be silicon oxynitride. Interfacial layer 24 provides for stabilizing the dangling bonds in high k layer 18. Typically, this interfacial layer of silicon oxynitride has a higher k than that of silicon oxide and is very thin, less than 10 Angstroms. Thus, the beneficial effect of passivating the top of nitride layer 16 is achieved with minimal reduction in the permittivity of the overall top dielectric layer comprised of high k dielectric layer 18 and interfacial layer 24. This very thin thickness of interfacial layer 24 is relatively easy to achieve due to the storage dielectric, silicon nitride layer 16, being silicon nitride.

Figure 4:
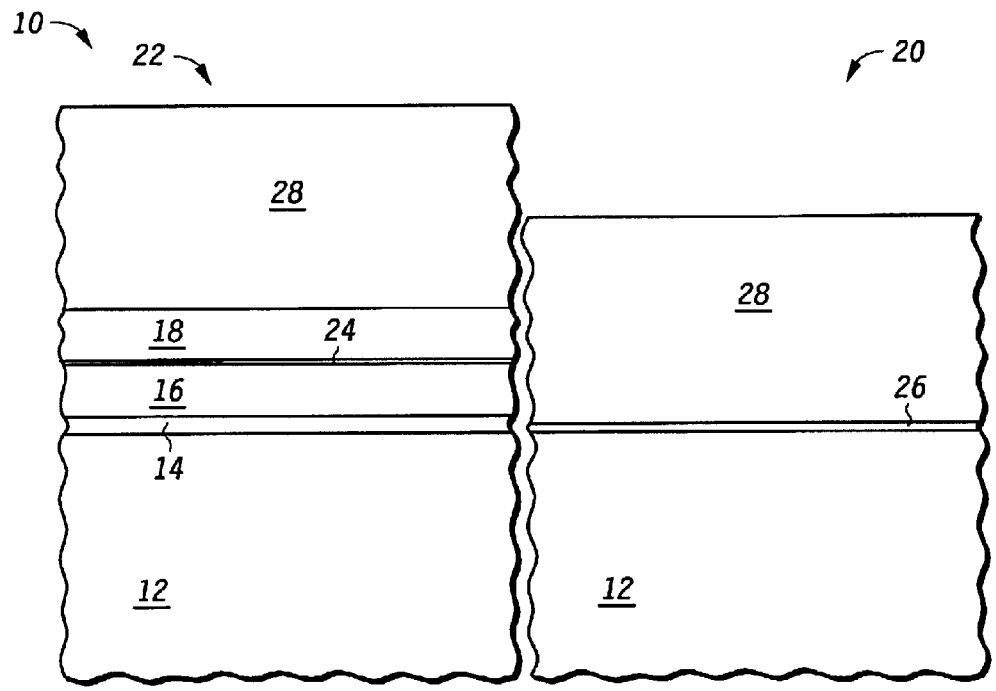

Shown in FIG. 4 is semiconductor device 10 after forming a polysilicon layer 28 over gate dielectric 26 in transistor portion 20 and high k dielectric layer 18 in NVM portion 22. Polysilicon is typically used for gates of transistors and NVM cells, but other materials may also be used. A refractory metal may be used in addition to the polysilicon and further a metal may used. It may even be desirable to have a different material for NVM portion 22 than for transistor portion 20.

Figure 5:
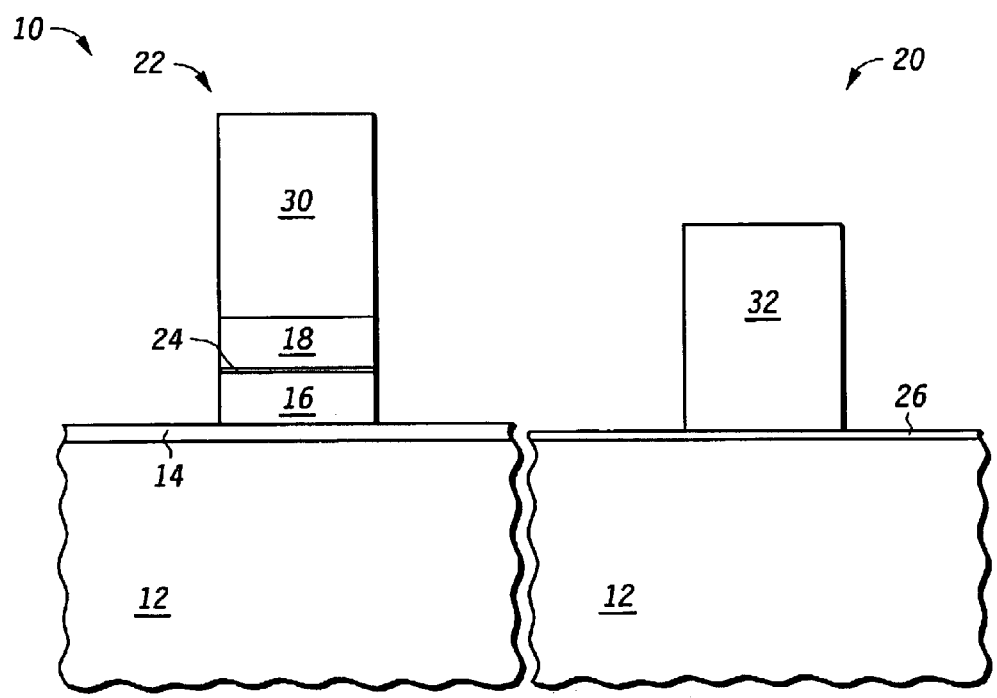

Shown in FIG. 5 is semiconductor device 10 after etching polysilicon layer 28 into gate 30 in NVM portion 22 and gate 32 in transistor portion 20. Also etched aligned to gate 30 are high k dielectric 18, interfacial layer 24, and silicon nitride layer 16.

Figure 6:
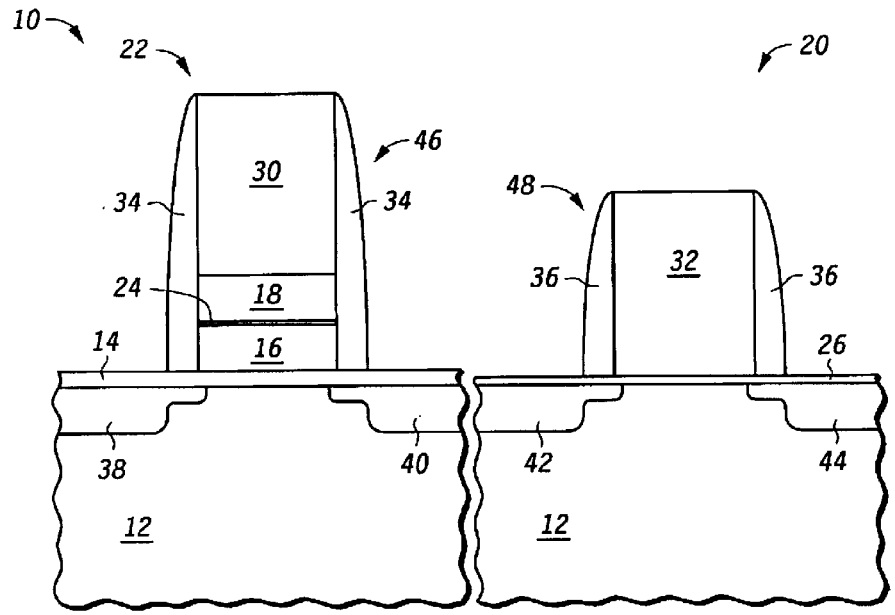

Shown in FIG. 6 is semiconductor device 10 after forming sidewall spacers 34 and 36 around gates 30 and 32, respectively, and source/drain regions 38 and 40 aligned to gate 30 and sidewall spacer 34 and source/drain regions 42 and 44 aligned to gate 32 and sidewall spacer 36. The term "source/drain" is used here, consistent with common usage, to denote a current electrode of a MOS transistor and to recognize that the current electrodes of a MOS transistor are typically interchangeable in functioning as either a source or a drain. These process steps result in a completed NVM cell 46 in NVM portion 22 and a completed transistor 48 in transistor portion 20. The result is that the top dielectric of NVM cell 46 provides a high degree of coupling between gate electrode 30 and silicon nitride layer 16. The high k dielectric layer 18 is relatively thick for low leakage, and is made in a way that is compatible with regular transistor formation. The high degree of coupling from high k dielectric layer 18 and its relatively high thickness results in erase times and leakage that are both acceptable.

Figure 7:
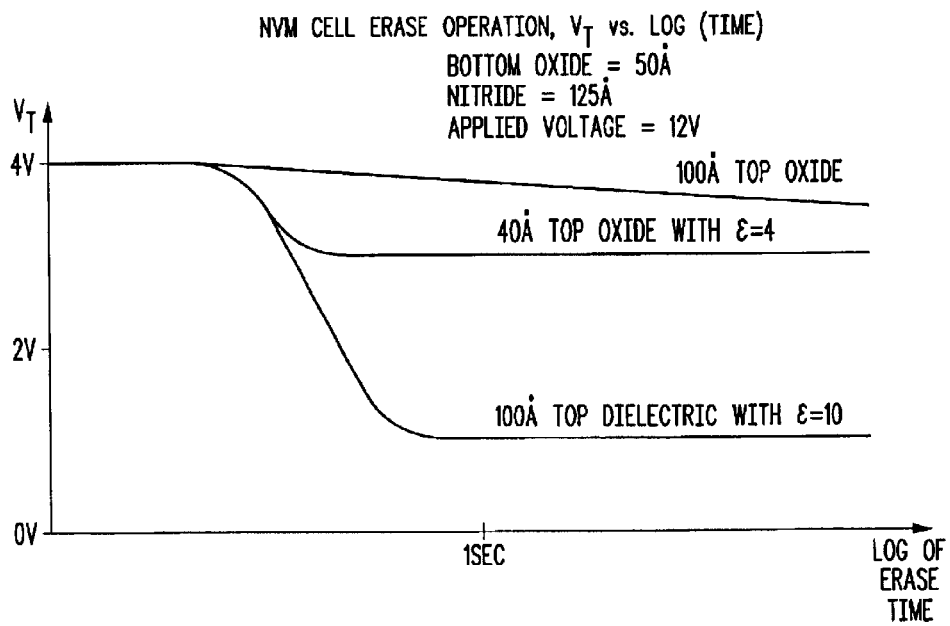
FIG. 7 is a graph useful in understanding a benefit of the invention.

Shown in FIG. 7 are erase time comparisons useful in understanding some of the benefits of NVM cell 46. This compares three cases in which the bottom dielectric is a silicon oxide having a thickness of 50 Angstroms, a nitride layer thickness of 125 Angstroms, and an applied voltage between gate and substrate of 12 volts. The three cases are a top silicon oxide of 100 Angstroms, a top silicon oxide of 40 Angstroms, and a top dielectric of high k material having a permittivity of 10 and a thickness of 100 Angstroms. Silicon oxide has a permittivity of about 4. In the first case, the 100 Angstroms of top silicon oxide provides so little coupling that the erase time is very slow, much slower than 1 second and unacceptable. The second case of a top dielectric of 40 Angstroms of silicon oxide results in an erase time of less than one second but the threshold voltage only changes from 4 to 3 volts. The programmed state with a threshold voltage of 4 volts is only 33% higher than that of the erased state. This small threshold differential between program and erase will result in slower and/or less reliable sensing. The third case, according to an embodiment of the invention, has a top dielectric with a total thickness of 100 Angstroms and an average permittivity of 10 that results in effectively performing an erase to a threshold voltage of about 1 volt in less than 1 second. In this case the programmed threshold voltage of 4 is four times (three times more than) the threshold voltage of the erased state. This is a very good margin for fast sensing.

Similar results can be achieved by other techniques. For example, an interfacial layer 24 can be formed in a separate step from the formation of gate dielectric 26. Interfacial layer 26 doesn't have to be silicon oxynitride but can be any layer that provides passivation of the storage dielectric. Important passivating aspects include reducing leakage through the top dielectric and reducing fixed charge in the top dielectric. Forming this interfacial layer has the effect of passivating the whole top dielectric not just at the interface between the high k dielectric and the storage dielectric. Also gate dielectric 26 itself may be a high k dielectric. In such case, it may desirable to form gate dielectric layer 26 and high k dielectric 18 at the same time so that they are the same thickness.

In the foregoing specification, the invention has been described with reference to specific embodiments. However, one of ordinary skill in the art appreciates that various modifications and changes can be made without departing from the scope of the present invention as set forth in the claims below. For example, the gate dielectric 26 can be a high k dielectric that is different in kind and/or thickness than that of high k dielectric 18. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. For example, this provides the benefits of using a high k dielectric for the top dielectric including a very thin and high k interfacial layer while retaining the benefits of a silicon oxide layer as the bottom dielectric. However, the benefits, advantages, solutions to problems, and any element (s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A dielectric storage memory cell comprising:

a substrate;

a first dielectric layer overlying the substrate and having a first relative permittivity a charge storage layer overlying the first dielectric layer the charge storage layer storing charge representative of a data value;

a second dielectric layer overlying the charge storage layer, the second dielectric layer having a second relative permittivity greater than the first relative permittivity;

an oxynitride interfacial layer interposed between the charge storage layer and the second dielectric layer having a thickness less than ten Angstroms for stabilizing dangling bonds in the second dielectric layer;

a gate electrode overlying the second dielectric layer and forming a control electrode of the dielectric storage memory cell; and first and second current electrodes formed within the substrate in close proximity to an area underlying the gate electrode, wherein higher relative permittivity of the second dielectric as compared to the first dielectric increases capacitive coupling between the gate electrode and locations within the charge storage layer containing stored charge while reducing charge leakage from the gate electrode to the charge storage layer.

2. The dielectric storage memory cell of claim 1 wherein the first dielectric layer comprises silicon oxide having a first thickness in a first range of thirty to one hundred Angstroms and the second dielectric layer comprises a metal oxide having a second thickness in a second range of seventy to two hundred fifty Angstroms.

3. The dielectric storage memory cell of claim 2 wherein the second thickness is about 100 Angstroms.

4. The dielectric storage memory cell of claim 1 wherein the second dielectric layer comprises silicon curia that is doped with an impurity to raise the relative permittivity of the second dielectric layer.

5. The dielectric storage memory cell of claim 1 further comprising:
   a transistor implemented on a same integrated circuit, the transistor having a gate electrode that is insulated from the substrate by a third dielectric layer having a dielectric thickness that in different from the first dielectric layer and rue second dielectric layer.

6. The dielectric storage memory cell of claim 1 wherein a ratio of the second permittivity to the first permittivity is at least one and one-half.

7. The dielectric storage memory cell of claim 1 wherein the second dielectric layer comprises at least one of hafnium oxide, aluminum oxide, or lanthanum oxide.

8. A dielectric storage memory cell comprising:
   a substrate;
   a first dielectric layer overlying the substrate and having a first relative permittivity
   a charge storage dielectric layer overlying the first dielectric layer, turn charge storage dielectric layer storing charge representative of a data value;
   an oxynitride layer overlying the charge storage dielectric layer;
   a second dielectric layer on the oxynitride layer, the second dielectric layer having a second relative permittivity greater than the first relative permittivity to accomplish at least one of controlling capacitive coupling through the second dielectric layer and reducing charge leakage through the second dielectric layer, wherein the dangling bonds of the second dielectric are stabilized by the oxynitride layer;
   a gate electrode overlying the second dielectric layer and forming a control electrode of the dielectric storage memory coil; and
   first and second current electrodes formed within the substrate in close proximity to an area underlying the gate electrode.

9. The dielectric storage memory cell of claim 8, wherein the second relative permittivity of use second dielectric layer is at least one and one-half times the first relative permittivity of the first dielectric layer.

10. The dielectric storage memory call or claim 8 wherein the first dielectric layer is silicon oxide and the second dielectric layer has a thickness between 70 and 250 Angstroms.

11. The dielectric storage memory cell of claim 8 wherein the first dielectric layer comprises a tunneling dielectric layer.

12. The dielectric storage memory cell of claim 8, wherein the charge storage layer comprise, nitride.

13. The dielectric storage memory cell of claim 12, wherein the oxynitride layer has a thickness of less the 10 Angstroms.

* * * * *